United States Patent [19]

Koike

[11] Patent Number: 4,716,318
[45] Date of Patent: Dec. 29, 1987

[54] LOW PASS FILTER FORMED IN AN INTEGRATED CIRCUIT

[75] Inventor: Hideharu Koike, Yokohama, Japan

[73] Assignee: Kabushiki Kaisha Toshiba, Kawasaki, Japan

[21] Appl. No.: 838,708

[22] Filed: Mar. 12, 1986

[30] Foreign Application Priority Data

Mar. 13, 1985 [JP] Japan ..................... 60-49974

[51] Int. Cl.⁴ ............................................. H03K 17/28
[52] U.S. Cl. ..................................... 307/520; 307/265; 307/234; 328/111
[58] Field of Search ............... 307/520, 443, 234, 517, 307/445, 265; 375/22, 37, 58; 328/111, 112, 162, 55, 165

[56] References Cited

U.S. PATENT DOCUMENTS

| | | | |
|---|---|---|---|
| 3,828,258 | 8/1974 | Hills et al. | 328/111 |
| 3,835,336 | 9/1974 | Block | 328/111 |
| 3,993,954 | 11/1976 | Sugai | 307/445 |
| 4,061,976 | 12/1977 | Sugai | 307/234 |
| 4,233,525 | 11/1980 | Takahashi et al. | 307/234 |
| 4,583,008 | 4/1986 | Grugett | 307/269 |

FOREIGN PATENT DOCUMENTS

| | | |
|---|---|---|
| 51-15362 | 2/1976 | Japan . |
| 51-134357 | 10/1976 | Japan . |
| 56-146323 | 11/1981 | Japan . |

*Primary Examiner*—Stanley D. Miller
*Assistant Examiner*—Timothy P. Callahan
*Attorney, Agent, or Firm*—Finnegan, Henderson, Farabow, Garrett & Dunner

[57] ABSTRACT

A low pass filter which has a plurality of NAND gates connected in series. Input signals are input directly to one input terminal of each of the respective NAND gates, respectively. Input signals are input through a plurality of inverters to the NAND gate of the initial stage. The NAND gate of the final stage is connected through even number of inverters to a circuit output node N2. An odd number of inverters are provided between the preceding and following NAND gates.

2 Claims, 18 Drawing Figures

FIG. 1
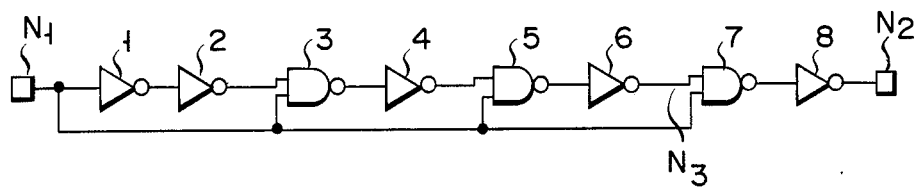
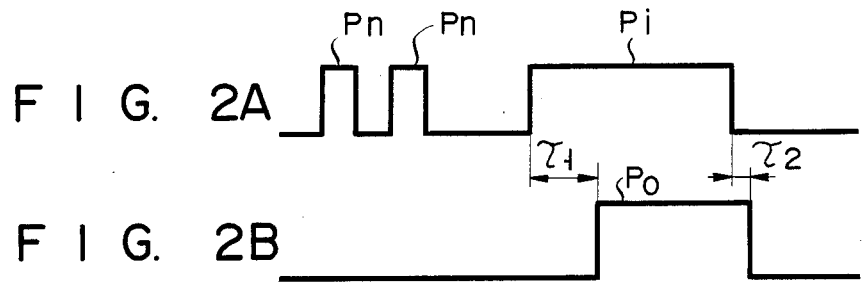
FIG. 2A
FIG. 2B
FIG. 3
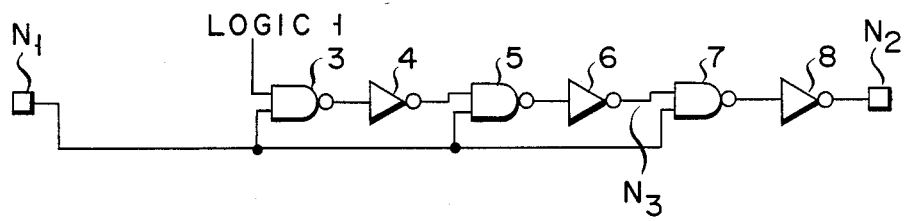
FIG. 4
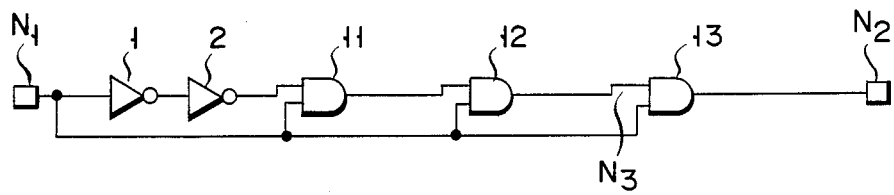

FIG. 5
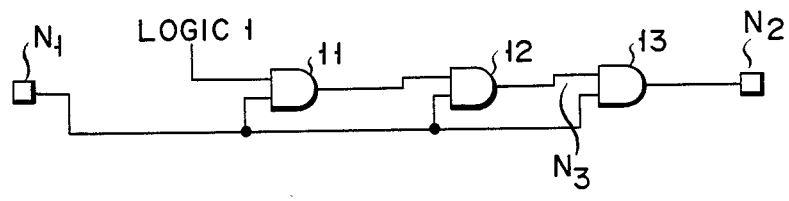
FIG. 6
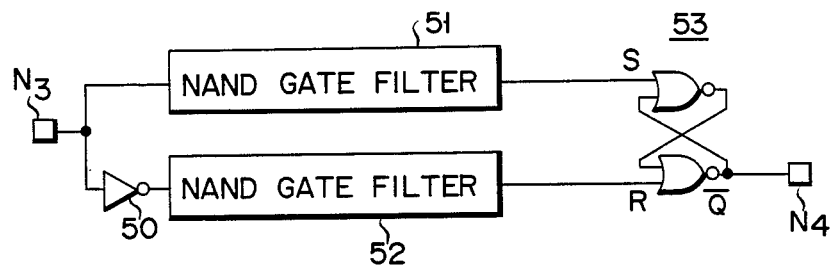
FIG. 7A
FIG. 7B
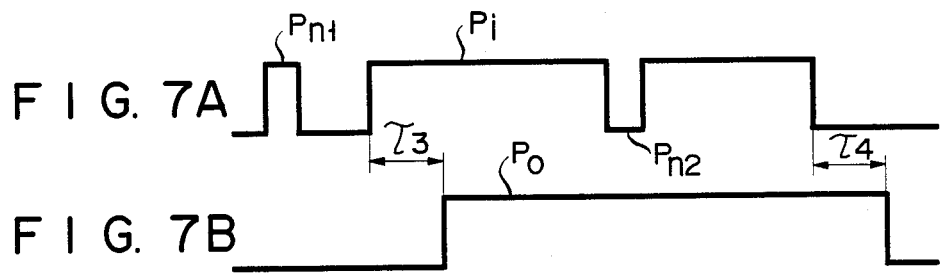
FIG. 8
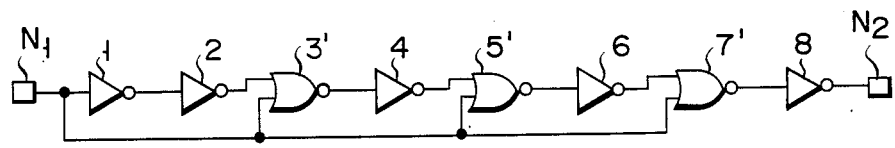

F I G. 9A
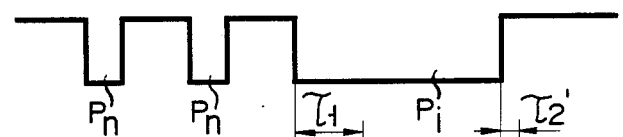
F I G. 9B
F I G. 10
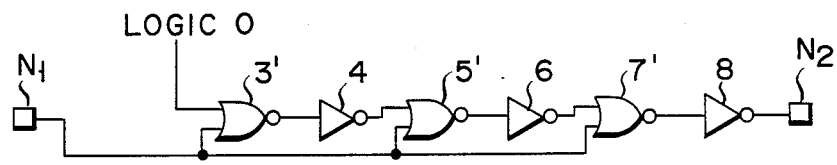
F I G. 11
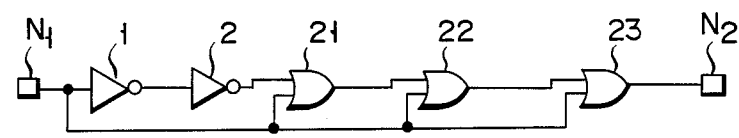

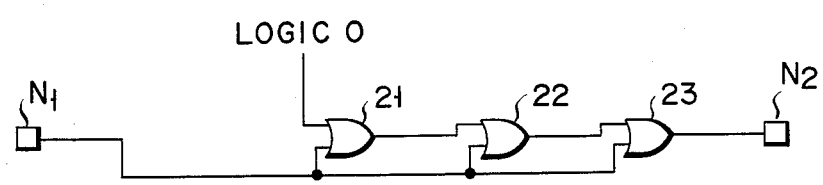
FIG. 12
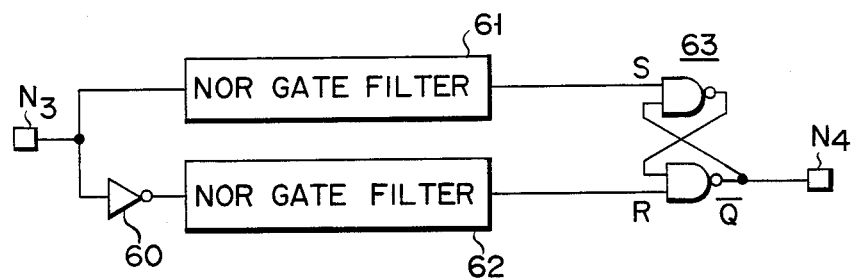
FIG. 13
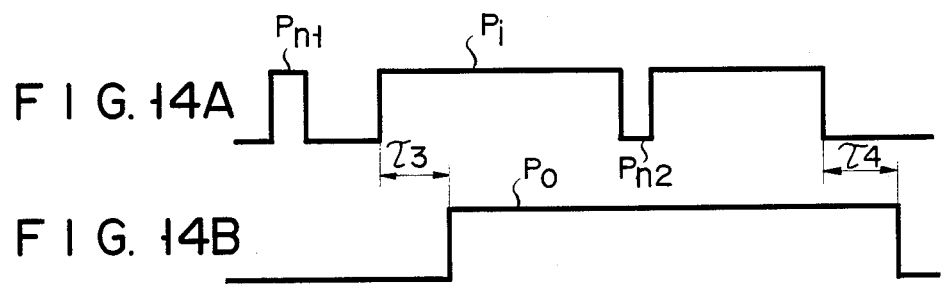
FIG. 14A
FIG. 14B

LOW PASS FILTER FORMED IN AN INTEGRATED CIRCUIT

BACKGROUND OF THE INVENTION

The present invention relates to a low pass filter for removing high frequency components from a logic circuit system.

In a conventional semiconductor device having a plurality of integrated circuits such as, for example, gate arrays provided and connected with each other on a circuit substrate, low pass filters made of discrete components such as resistors and capacitors for removing the high frequency components contained in an input signal are attached externally to the input terminals of the respective integrated circuits.

However, the external circuits not only occupy a lot of space, but are complicated to manufacture. Further, it is difficult to completely remove noise components with such filters. The external circuits also cannot remove extremely weak noise signals generated due to the timing difference of input signals of logic gates in integrated circuits.

SUMMARY OF THE INVENTION

The present invention has been made in consideration of this and has for its object to provide a low pass filter capable of removing noise components contained in an input signal and also removing a noise generated in integrated circuits.

According to the invention, there is provided a low pass filter formed in an integrated circuit comprising:
  a circuit input terminal,
  a circuit output terminal,
  a plurality of NAND gates connected in series between said circuit input terminal and said circuit output terminal, an input signal directly input to one input terminal of said each NAND gate;
  even number stages of inverters connected in series between said circuit input terminal and the other input terminal of said NAND gate of the initial stage;
  odd number stages of inverters connected between the output terminal of said NAND gate of the previous stage and the other input terminal of said NAND gate of next stage, and
  odd number stages of inverters connected between the output terminal of said NAND gate of the final stage and said circuit output terminal.

According to the invention, there is further provided a low pass filter formed in an integrated circuit comprising:
  a circuit input terminal,
  a circuit output terminal,
  a plurality of AND gates connected in series between said circuit input terminal and said circuit output terminal, an input signal directly input to one input terminal of said each AND gate; and
  even number stages of inverters connected in series between said circuit input terminal and the other input terminal of said AND gate of the initial stage.

According to the invention, there is still further provided a low pass filter formed in an integrated circuit comprising:
  a circuit input terminal,
  a circuit output terminal,
  a plurality of NAND gates connected in series between said circuit input terminal and said circuit output terminal, an input signal directly input to one input terminal of said each NAND gate, the other input terminal of said NAND gate of the initial stage being connected to a logic "1" level,
  odd number stages of inverters connected in series between the output terminal of said NAND gate of the previous stage and the other input terminal of said NAND gate of next stage, and
  odd number stages of inverters connected in series between the output terminal of said NAND gate of the final stage and said circuit output terminal.

According to the invention, there is yet another provided a low pass filter formed in an integrated circuit comprising:
  a circuit input terminal,
  a circuit output terminal, and
  a plurality of AND gates connected in series between said circuit input terminal and said circuit output terminal, an input signal directly input to one input terminal of said each AND gate, the other input terminal of said AND gate of the initial stage being connected to logic "1" level, the output terminal of said AND gate of the previous stage being connected to the other input terminal of said AND gate of next stage, and the output terminal of said AND gate of the final stage being connected to said circuit output terminal.

According to the invention, there is further provided a low pass filter apparatus formed in an integrated circuit comprising:
  an input terminal of said apparatus,
  an output terminal of said apparatus,
  first and second low pass filters as just mentioned above, the circuit input terminals of said first and second low pass filters commonly connected to the input terminal of said apparatus;
  an inverter inserted between the input terminal of said apparatus and the input terminal of said second filter; and
  a set/reset type flip-flop circuit having a set input terminal connected to said circuit output terminal of said first filter, a reset terminal connected to said circuit output terminal of said second filter, and an output terminal connected to said output terminal of said apparatus.

According to the invention, there is still further provided a low pass filter formed in an integrated circuit comprising:
  a circuit input terminal,
  a circuit output terminal,
  a plurality of NOR gates connected in series between said circuit input terminal and said circuit output terminal, an input signal directly input to one input terminal of said each NOR gate;
  even number stages of inverters connected in series between said circuit input terminal and the other input terminal of said NOR gate of the initial stage;
  odd number stages of inverters connected between the output terminal of said NOR gate of the previous stage and the other input terminal of said NOR gate of next stage, and
  odd number stages of inverters connected between the output terminal of said NAND gate of the final stage and said circuit output terminal.

According to the invention, there is yet further provided a low pass filter formed in an integrated circuit comprising:
  a circuit input terminal,
  a circuit output terminal, a plurality of OR gates connected in series between said circuit input terminal and said circuit output terminal, an input signal directly input to one input terminal of said each OR gate; and even number stages of inverters connected in series between said circuit input terminal and the other input terminal of said OR gate of the initial stage.

According to the invention, there is further provided a low pass filter formed in an integrated circuit comprising:
  a circuit input terminal,
  a circuit output terminal,
  a plurality of NOR gates connected in series between said circuit input terminal and said circuit output terminal, an input signal directly input to one input terminal of said each NOR gate, the other input terminal of said NOR gate of the initial stage being connected to a logic "0" level,
  odd number stages of inverters connected in series between the output terminal of said NOR gate of the previous stage and the other input terminal of said NOR gate of next stage, and
  odd number stages of inverters connected in series between the output terminal of said NOR gate of the final stage and said circuit output terminal.

According to the invention, there is still further provided a low pass filter formed in an integrated circuit comprising:
  a circuit input terminal,
  a circuit output terminal, and
  a plurality of OR gates connected in series between said circuit input terminal and said circuit output terminal, an input signal directly input to one input terminal of said each OR gate, the other input terminal of said OR gate of the initial stage being connected to a logic "0" level, the output terminal of said OR gate of the previous stage being connected to the other input terminal of said OR gate of next stage, and the output terminal of said OR gate of the final stage being connected to said circuit output terminal.

According to the invention, there is yet further provided a low pass filter apparatus formed in an integrated circuit comprising:
  an input terminal of said apparatus,
  an output terminal of said apparatus,
  first and second low pass filters just as mentioned above, the circuit input terminals of said first and second low pass filters commonly connected to the input terminal of said apparatus;
  an inverter inserted between the input terminal of said apparatus and the input terminal of said second filter; and
  a set/reset type flip-flop circuit having a set input terminal connected to said circuit output terminal of said first filter, a reset terminal connected to said circuit output terminal of said second filter, and an output terminal connected to said output terminal of said apparatus.

BRIEF DESCRIPTION OF THE DRAWINGS

FIG. 1 is a circuit diagram showing an embodiment of a low pass filter according to the present invention;

FIGS. 2A and 2B are views showing the waveforms of input and output signals of a low pass filter shown in FIG. 1;

FIG. 3 is a circuit diagram showing another embodiment of a low pass filter according to the present invention;

FIGS. 4 and 5 are circuit diagrams showing still another embodiments of a low pass filter of the present invention;

FIG. 6 is a view showing still another embodiment of the present invention; and

FIGS. 7A and 7B are timing charts of the embodiment shown in FIG. 6.

FIG. 8 is a circuit diagram showing a further embodiment of a low pass filter according to the present invention;

FIGS. 9A and 9B are views showing the waveforms of input and output signals of a low pass filter shown in FIG. 8;

FIG. 10 is a circuit diagram showing still another embodiment of a low pass filter according to the present invention;

FIGS. 11 and 12 are circuit diagrams showing still another embodiments of a low pass filter of the present invention;

FIG. 13 is a view showing still another embodiment of the present invention; and FIGS. 14A and 14B are timing charts of the embodiment shown in FIG. 13.

DETAILED DESCRIPTION OF THE PREFERRED EMBODIMENTS

Embodiments of a low pass filter according to the present invention will be described in detail with reference to the accompanying drawings.

FIG. 1 shows a NAND gate type low pass filter of an embodiment of the present invention. This low pass filter is connected to an input unit, an intermediate unit or an output unit of a logic circuit system in an integrated circuit, or is connected between an input terminal and an output terminal of an integrated circuit. NAND gates 3, 5 and 7 are connected in series between an input node N1 of a circuit input terminal and an output node N2 of a circuit output terminal. One input terminal of each of the NAND gates 3, 5 and 7 are connected directly to the input node N1. The input node N1 is also connected through two inverters 1 and 2 to the other input terminal of the NAND gates 3. The output terminal of the NAND gate 3 is connected through an inverter 4 to the other input terminal of the NAND gate 5. The output terminal of the NAND gate 5 is connected through an inverter 6 to the other input terminal of the NAND gate 7. The output terminal of the NAND gate 7 is connected through an inverter 8 to the output node N2.

The operation of the filter in FIG. 1 will be described with reference to timing charts of FIGS. 2A and 2B.

The case that an input signal (FIG. 2A) input to the input node N1 includes an input pulse Pi of logic "1" level and a noise pulse Pn of logic "1" level will be considered. When a period of time from the rise of the input signal to the rise of the output signal presented at the output node (a delay time at the rise) is represented by $\tau_1$, the $\tau_1$ is a total of the delay times in the logic elements from the input node N1 to the output node N2. When a period of time from the fall of the input signal to the fall of the output signal (a delay time at the fall) is represented by $\tau_2$, the $\tau_2$ is a total of the delay times in the NAND gate 7 of the final stage and the inverter 8 of the final stage. Therefore, the following condition exists:

$$\tau_1 > \tau_2$$

The total of the delay times from the input node N1 to the NAND gate 7, $\tau_0$ can be represented by the following equation.

$$\tau_0 = \tau_1 - \tau_2$$

The level of the input signal is logic "0" level in the initial state. Thus, the output logic level of the NAND gate 3 of the initial stage is "1", and the output logic level of the output node N2 is eventually "0". When the input signal rises from logic "0" level to logic "1" level, this level change is sequentially propagated through the respective logic elements. If the time period of the logic "1" level is larger than the $\tau_1$, the logic level of the output signal of the output node N2 becomes "1". When the input signal falls from the logic "1" level to the logic "0" level and a time $\tau_2$ is elapsed from the fall, the filter is reset to the initial state, and the logic level of the output signal becomes "0". As apparent from the above-mentioned operation, if the width of the input pulse is wider than the $\tau_0$, an output signal which rises with delay of $\tau_1$ from the rise of the input pulse and falls with delay of $\tau_2$ from the fall of the input pulse is presented at the output node N2. If the width of the input pulse is, on the other hand, narrower than the $\tau_0$, the NAND gates 3, 5 and 7 are reset before a change in the logic level due to the rise of the input pulse is transmitted through the respective logic elements to the output node N2. Therefore, no pulse is presented at the output node N2.

Since the noise pulse Pn has in general, as shown in FIG. 2A, a narrow width, the filter of the configuration in FIG. 1 of the invention can remove the noise pulse.

As shown by another embodiment in FIG. 3, the other input terminal of a NAND gate 3 of an initial stage may be connected to a fixed logic level "1". In this embodiment, substantially the same results as obtained in the FIG. 1 embodiment may be achieved.

FIG. 4 shows an AND gate type low pass filter of still another embodiment of the present invention. This embodiment is different from the embodiment in FIG. 1 at the point that the logic circuit which has the NAND gate 3 and the inverter 4 is composed of an AND gate 11, the logic circuit which has the NAND gate 5 and the inverter 6 is composed of an AND gate 12, and the logic circuit which has the NAND gate 7 and the inverter 8 is composed of an AND gate 13. The functions of the respective AND gates are substantially equivalent to those of the logic circuits having the NAND gates and the inverters, and the other configuration is substantially equivalent to the embodiment in FIG. 1, and the same reference numerals as in the first embodiment in FIG. 1 denote the same parts in this embodiment, and the detailed description thereof will be omitted. Since the principle of the operation is substantially equivalent to that in the embodiment in FIG. 1, and the description thereof will be omitted.

As shown in still another embodiment of FIG. 5, the other input terminal of the AND gate 11 of the initial stage (a terminal connected to the output terminal of the inverter 2) may be connected to a fixed logic level "1" equivalent to the case of FIG. 3.

FIG. 6 shows still another embodiment of the present invention. This embodiment shows a filter apparatus which employs two NAND gate type filters shown in FIG. 1.

An input node of a filter 51 is connected directly to an input node N3 of the entire circuit, and an input node of a filter 52 is connected through an inverter 50 to an input node N3 of the entire circuit. The output node of the filter 51 is connected to a set terminal S of a set/reset type flip-flop circuit 53, and the output node of the filter 52 is connected to a reset terminal R. A flip-flop circuit 53 comprises cross-connected two NOR gates. The output terminal $\overline{Q}$ of the flip-flop 53 is connected to an output terminal N4 of the entire circuit.

The filter apparatus in FIG. 6 can remove both a noise pulse of logic "0" level and a noise pulse of logic "1" level. More specifically, as shown in FIG. 7A, the input signal includes noise pulse Pn1 of logic "1" level and noise pulse Pn2 of logic "0" level. Noise pulse Pn1 of logic "1" level is removed by filter 51, and noise pulse Pn2 of logic "0" level is removed by the series circuit of inverter 50 and filter 52. A leading edge of input voltage Pi of logic "1" level is transmitted with a delay time t3 (FIG. 7B) through filter 51 to set flip-flop circuit 53. A trailing edge of input voltage Pi is transmitted with a delay time t4 (FIG. 7B) through inverter 50 and filter 52 to reset flip-flop. Therefore, an output pulse P0 of logic "1" level from which noise pulses Pn1, Pn2 are removed is presented at the output of the flip-flop circuit 53. When a period of time from the rise of the input signal to the rise of the output signal is represented by $\tau_3$ and a period of time from the fall of the input signal to the fall of the output signal is represented by $\tau_4$, the noise pulses Pn1, Pn2 have widths shorter than the periods $\tau_3$, $\tau_4$. Filters 51 and 52 may be formed of the filters shown in FIG. 3, 4 or 5.

FIG. 8 shows a NOR gate type low pass filter of a further embodiment of the present invention. NOR gates 3', 5' and 7' are connected in series between input node N1 of a circuit input terminal and output node N2 of a circuit output terminal. One input terminal of each of NOR gates 3', 5' and 7' are connected directly to input node N1. The input node N1 is also connected through two inverters 1 and 2 to the other input terminal of the NOR gates 3'. The output terminal of the NOR gate 3' is connected through an inverter 4 to the other input terminal of the NOR gate 5'. The output terminal of the NOR gate 5' is connected through an inverter 6 to the other input terminal of the NOR gate 7'. The output terminal of the NOR gate 7' is connected through an inverter 8 to the output node N2.

The operation of the filter in FIG. 8 will be described with reference to timing charts of FIGS. 9A and 9B.

The case that an input signal (FIG. 9A) input to the input node N1 includes an input pulse Pi of logic "0" level and a noise pulse Pn of logic "0" level will be considered. When a period of time from the fall of the input signal to the fall of the output signal presented at the output node (a delay time at the fall) is represented by $\tau_1'$, the $\tau_1'$ is a total of the delay times in the logic elements from the input node N1 to the output node N2. When a period of time from the rise of the input signal to the rise of the output signal (a delay time at the rise) is represented by $\tau_2'$, the $\tau_2'$ is a total of the delay times in the NOR gate 7' of the final stage and the inverter 8 of the final stage. Therefore, the following condition exists:

$$\tau_1' > \tau_2'$$

The total of the delay times from the input node N1 to the NOR gate 7', $\tau_0'$ can be represented by the following equation.

$$\tau_0' = \tau_1' - \tau_2'$$

The level of the input signal is logic "1" level in the initial state. Thus, the output logic level of the NOR gate 3' of the initial stage is "0", and the output logic level of the output node N2 is eventually "1". When the input signal falls from logic "1" level to logic "0" level, this level change is sequentially propagated through the respective logic elements. If the time period of the logic "0" level is larger than the $\tau_1'$, the logic level of the output signal of the output node N2 becomes "0". When the input signal rises from the logic "0" level to the logic "1" level and a time $\tau_2'$ is elapsed from the rise, the filter is reset to the initial state, and the logic level of the output signal becomes "1". As apparent from the above-mentioned operation, if the width of the input pulse is wider than the $\tau_0'$, an output signal which falls with delay of $\tau_1'$ from the fall of the input pulse and rise with delay of $\tau_2'$ from the rise of the input pulse is presented at the output node N2. If the width of the input pulse is, on the other hand, narrower than the $\tau_0'$, the NOR gates 3',5' and 7' are reset before a change in the logic level due to the fall of the input pulse is transmitted through the respective logic elements to the output node N2. Therefore, no pulse is presented at the output node N2.

Since the noise pulse Pn has in general, as shown in FIG. 9A, a narrow width, the filter of the configuration in FIG. 8 of the invention can remove the noise pulse.

As shown by still another embodiment in FIG. 10, the other input terminal of a NOR gate 3' of an initial stage may be connected to a fixed logic level "0". In this embodiment, substantially the same results as obtained in the FIG. 8 embodiment may be achieved.

FIG. 11 shows an OR gate type low pass filter of still another embodiment of the present invention. This embodiment is different from the embodiment in FIG. 8 at the point that the logic circuit which has the NOR gate 3' and the inverter 4 is composed of an OR gate 21, the logic circuit which has the NOR gate 5' and the inverter 6 is composed of an OR gate 22, and the logic circuit which has the NOR gate 7' and the inverter 8 is composed of an OR gate 33. The functions of the respective OR gates are substantially equivalent to those of the logic circuits having the NOR gates and the inverters, and the other configuration is substantially equivalent to the embodiment in FIG. 8, and the same reference numerals as in the embodiment in FIG. 8 denote the same parts in this embodiment, and the detailed description thereof will be omitted. Since the principle of the operation is substantially equivalent to that in the embodiment in FIG. 1, and the description thereof will be omitted.

As shown in still another embodiment of FIG. 12, the other input terminal of the OR gate 21 of an initial stage (a terminal connected to the output terminal of the inverter 2) may be connected to a fixed logic level "0" equivalent to the case of FIG. 10.

FIG. 13 shows still another embodiment of the present invention. This embodiment shows a filter apparatus which employs two NOR gate type filters shown in FIG. 8.

An input node of a filter 61 is connected directly to an input node N3 of the entire circuit, and an input node of a filter 62 is connected through an inverter 60 to an input node N3 of the entire circuit. The output node of the filter 61 is connected to a set terminal S of a set/reset type flip-flop circuit 63, and the output node of the filter 62 is connected to a reset terminal R. A flip-flop circuit 63 comprises cross-connected two NOR gates. The output terminal $\overline{Q}$ of the flip-flop 63 is connected to an output terminal N4 of the entire circuit.

The filter apparatus in FIG. 13 can remove both a noise pulse of logic "0" level and a noise pulse of logic "1" level. More specifically, as shown in FIG. 14A, the input signal includes noise pulse Pn1 of logic "1" level and noise pulse Pn2 of logic "0" level. Noise pulse Pn1 of logic "1" level is removed by filter 51, and noise pulse Pn2 of logic "0" level is removed by the series circuit of inverter 50 and filter 52. A leading edge of input voltage Pi of logic "1" level is transmitted with a delay time t3 (FIG. 14B) through filter 51 to set flip-flop circuit 53. A trailing edge of input voltage Pi is transmitted with a delay time t4 (FIG. 14B) through inverter 50 and filter 52 to reset flip-flop. Therefore, an output pulse P0 of logic "1" level from which noise pulses Pn1, Pn2 are removed is presented at the output of the flip-flop circuit 63. When a period of time from the rise of the input signal to the rise of the output signal is represented by $\tau_3$ and a period of time from the fall of the input signal to the fall of the output signal is represented by $\tau_4$, the noise pulses Pn1, Pn2 have widths shorter than the periods $\tau_3$, $\tau_4$. Filters 61 and 62 may be formed of the filters shown in FIG. 10, 11 or 12.

According to the present invention as described above, the low pass filter of the present invention is composed of only the logic elements. Therefore, the low pass filter can be formed in a semiconductor integrated circuit. Consequently, the low pass filter of the present invention can remove noise components contained in the input signal without necessity of a large occupying space nor complex manufacturing steps, and can also remove a noise generated in the integrated circuit.

What is claimed is:

1. A low pass filter apparatus formed in an integrated circuit comprising:
    an input terminal of said apparatus;
    an output terminal of said apparatus;
    a first low pass filter circuit including
        a first low pass filter circuit input terminal connected to said input terminal of said apparatus,
        a first low pass filter circuit output terminal,
        a plurality of series connected NAND gates connected between said first low pass filter circuit input terminal and said first low pass filter circuit output terminal, the first input terminal of each of said NAND gates being directly connected to said first low pass filter circuit input terminal,
        an even number of inverters connected in series between said first low past filter circuit input terminal and the second input terminal of the first of said series connected NAND gates,
        an odd number of inverters connected between the output terminal of each of said series connected NAND gates and the second input terminal of the following NAND gate of said series connected NAND gates, and
        an odd number of inverters connected between the output terminal of the last NAND gate of said series connected NAND gate and said first low pass filter circuit output terminal; a second low pass filter circuit including
        a second low pass filter circuit input terminal connected to said input terminal of said apparatus,
        a second low pass filter circuit output terminal, a plurality of series connected NAND gates connected between said second low pass filter circuit input terminal and said second low pass filter circuit output terminal, the first input terminal of each of said NAND gates being directly connected to said second low pass filter circuit input terminal, an even number of inverters connected in series between said second low pass filter circuit input terminal and the second input terminal of the first of said series connected NAND gates, an odd number of inverters connected between the output terminal of each of said series connected NAND gates and the second input terminal of the following NAND gate of said series connected NAND gates, and an odd number of inverters connected between the output terminal of the last NAND gate of said series connected NAND gates and said second low pass filter circuit output terminal;

an inverter inserted between said input terminal of said apparatus and said second low pass filter circuit input terminal; and a set/reset type flip-flop circuit having a set input terminal connected to said first low pass filter circuit output terminal, a reset input terminal connected to said second low pass filter circuit output terminal, and an output terminal connected to said output terminal of said apparatus.

2. A low pass filter apparatus formed in an integrated circuit comprising:

an input terminal of said apparatus;

an output terminal of said apparatus;

a first low pass filter circuit including a first low pass filter circuit input terminal connected to said input terminal of said apparatus, a first low pass filter circuit output terminal, a plurality of series connected NOR gates connected between said first low pass filter circuit input terminal and said first low pass filter circuit output terminal, the first input terminal of each of said NOR gates being directly connected to said first low pass filter circuit input terminal, an even number of inverters connected in series between said first low pass filter circuit input terminal and the second input terminal of the first of said series connected NOR gates, an odd number of inverters connected between the output terminal of each of said series connected NOR gates and the second input terminal of the following NOR gate of said series connected NOR gates, and an odd number of inverters connected between the output terminal of the last NOR gate of said series connected NOR gates and said first low pass filter circuit output terminal; a second low pass filter circuit including a second low pass filter circuit output terminal, a plurality of series connected stages of NOR gates connected between said second low pass filter circuit input terminal and said second low pass filter circuit output terminals, the first input terminal of each of said NOR gates being directly connected to said second low pass filter circuit input terminal, an even number of inverters connected in series between said second low pass filter circuit input terminal and the second input terminal of the first of said series connected NOR gates, an odd number of inverters connected between the output terminal of each of said series connected NOR gates and the second input terminal of the following NOR gate of said series connected NOR gates, and an odd number of inverters connected between the output terminal of the last NOR gate of said series connected NOR gates and said second low pass filter circuit output terminal;

an inverter inserted between said input terminal of said apparatus and said second low pass filter circuit input terminal; and a set/reset type flip-flop circuit having a set input terminal connected to said first low pass filter circuit output terminal, a reset terminal connected to said second low pass filter circuit output terminal, and an output terminal connected to said output terminal of said apparatus.

* * * * *